(12) United States Patent
Noma et al.

(10) Patent No.: US 9,373,441 B2
(45) Date of Patent: Jun. 21, 2016

(54) COMPOSITE ELECTRONIC COMPONENT

(71) Applicant: Murata Manufacturing Co., Ltd., Kyoto-fu (JP)

(72) Inventors: Takashi Noma, Kyoto-fu (JP); Tetsuya Ikeda, Kyoto-fu (JP)

(73) Assignee: MURATA MANUFACTURING CO., LTD., Kyoto-Fu (JP)

(*) Notice: Subject to any disclaimer, the term of this patent is extended or adjusted under 35 U.S.C. 154(b) by 147 days.

(21) Appl. No.: 14/254,252

(22) Filed: Apr. 16, 2014

(65) Prior Publication Data
US 2015/0302980 A1 Oct. 22, 2015

(30) Foreign Application Priority Data

Oct. 18, 2011 (JP) .................................. 2011-228839

(51) Int. Cl.
| | |
|---|---|
| *H01F 5/00* | (2006.01) |
| *H01F 27/28* | (2006.01) |
| *H01F 27/24* | (2006.01) |
| *H01F 27/34* | (2006.01) |

(52) U.S. Cl.
CPC .............. *H01F 27/34* (2013.01); *H01F 27/24* (2013.01); *H01F 27/2804* (2013.01); *H01F 2027/2809* (2013.01)

(58) Field of Classification Search
None
See application file for complete search history.

(56) References Cited

U.S. PATENT DOCUMENTS

| | | | | |
|---|---|---|---|---|
| 5,530,411 A | * | 6/1996 | Nakata | H03H 1/0007 333/185 |
| 8,422,190 B2 | * | 4/2013 | Ito | H01F 17/0006 361/119 |

FOREIGN PATENT DOCUMENTS

| | | |
|---|---|---|
| JP | 2004-339031 A | 12/2004 |
| JP | 2006-041081 A | 2/2006 |
| JP | 2006-310712 A | 11/2006 |
| JP | 2010-109312 A | 5/2010 |
| JP | 2011-187676 A | 9/2011 |

OTHER PUBLICATIONS

International Search Report for Application No. PCT/JP2012/076169 dated Dec. 25, 2012.
Written Opinion of the International Searching Authority for Application No. PCT/JP2012/076169 dated Dec. 25, 2012.

* cited by examiner

*Primary Examiner* — Elvin G Enad
*Assistant Examiner* — Ronald Hinson
(74) *Attorney, Agent, or Firm* — Pearne & Gordon LLP

(57) ABSTRACT

A composite electronic component with a built-in coil is provided which can be produced inexpensively, which can effectively increase insulating reliability, and which has the antistatic function. Coil wirings are disposed inside a sintered body that is formed by stacking a plurality of ferrite layers, which are fired as an integral unit. Voltage nonlinear members are incorporated in the sintered body at a different height position from those of the coil wirings. First inner electrodes and second inner electrodes are disposed in opposing relation with the voltage nonlinear members interposed therebetween. A magnetic circuit forming portion is constituted by a part of the ferrite layers and the coil wirings in a portion in which the coil wirings are arranged, and an antistatic portion is constituted in a portion in which the remaining ferrite layers, the voltage nonlinear members, and the first and second inner electrodes are arranged.

14 Claims, 10 Drawing Sheets

COMPOSITE ELECTRONIC COMPONENT

BACKGROUND OF THE INVENTION

1. Field of the Invention

The present invention relates to a composite electronic component using a sintered body that is formed by firing a plurality of ferrite layers as an integral unit, and more particularly to a composite electronic component in which a magnetic circuit forming portion and an antistatic circuit portion are constituted in the sintered body.

2. Description of Related Art

With the widespread use of high-speed serial communication, a common-mode choke coil adaptable for a high-frequency range is demanded. ICs used in the high-speed serial communication are generally vulnerable to static electricity. Accordingly, those ICs need to be protected against static electricity. From that point of view, a composite component is demanded which includes the common-mode choke coil and a static electricity protection element in an integral unit.

Patent Document 1, listed blow, discloses a composite electronic component illustrated in an exploded perspective view of FIG. 11. In the disclosed composite electronic component 1001, a common-mode filter layer 1002a and an antistatic element layer 1002b are sandwiched between first and second magnetic substrates 1001a and 1001b. The common-mode filter layer 1002a includes spiral conductors 1003a and 1003b. The spiral conductors 1003a and 1003b are magnetically coupled to each other. The antistatic element layer 1002b includes gap electrodes 1004 and 1005, and a varistor layer 1006 covering the gap electrodes 1004 and 1005.

The spiral conductors 1003a and 1003b are each formed on an insulating layer by the thin-film forming method.

In the composite electronic component 1001, a magnetic ferrite layer is arranged between insulating layers in the common-mode filter layer 1002a. Furthermore, plural insulating layers are stacked in the antistatic element layer 1002b.

On the other hand, Patent Document 2, listed below, discloses a composite electronic component in which a magnetic ferrite layer and a multilayer varistor layer made of ZnO are stacked and fired as an integral unit.

Furthermore, Patent Document 3, listed below, discloses a composite electronic component in which a magnetic ferrite layer including a coil conductor made of a thick film and a multilayer antistatic portion made of ZnO are stacked with a stress relaxation layer interposed therebetween, and they are fired as an integral unit.

CITATION LIST

Patent Document

Patent Document 1: Japanese Unexamined Patent Application Publication No. 2010-109312
Patent Document 2: Japanese Unexamined Patent Application Publication No. 2006-310712
Patent Document 3: Japanese Unexamined Patent Application Publication No. 2006-41081

BRIEF SUMMARY OF THE INVENTION

Technical Problem

The composite electronic component 1001 disclosed in Patent Document 1 has the problem that the spiral conductors 1003a and 1003b are formed by the thin film process and the production cost is increased.

The composite electronic component disclosed in Patent Document 2 has the problem that when the magnetic ferrite layer and the multilayer varistor layer made of ZnO are fired, interlayer peeling is apt to occur because of not only a difference in shrinkage rate, but also a difference in coefficient of linear expansion between both the layers. Therefore, insulating reliability is low.

In the composite electronic component disclosed in Patent Document 3, peeling between the magnetic ferrite and the multilayer antistatic portion is suppressed by the stress relaxation layer. With the provision of the stress relaxation layer, however, a thickness increases and size reduction is difficult to realize. Moreover, even with the provision of the stress relaxation layer, it is difficult to positively suppress interlayer peeling between the magnetic ferrite and the multilayer antistatic portion. Thus, insulating reliability is low as in the above case.

In addition, characteristics of a varistor material, i.e., a voltage nonlinear material, greatly change with absorption of moisture, etc. In the composite electronic components of the type disclosed in Patent Documents 2 and 3, characteristics may degrade by moisture in air, etc. in a portion where the varistor material is exposed to the outside. In other words, the presence of the antistatic portion being exposed to the outside also causes the problem with reduction of the insulating reliability.

An object of the present invention is to provide a composite electronic component, which includes a magnetic circuit forming portion and an antistatic portion both formed as an integral unit by firing, which has good insulating reliability, and which can be formed in a small size at a low cost.

Solution to Problem

The present invention provides a composite electronic component including a sintered body that is formed by stacking a plurality of ferrite layers and by firing the ferrite layers as an integral unit. In the present invention, a coil wiring is disposed inside the sintered body. In the sintered body, a voltage nonlinear member is incorporated at a height position different from that of the coil wiring. First and second inner electrodes are opposed to each other with the voltage nonlinear member interposed between the first and second inner electrodes. Furthermore, first to third outer electrodes are formed on one or more outer surfaces of the sintered body.

In the present invention, the first outer electrode is electrically connected to one end of the coil wiring, and the second outer electrode is electrically connected to the other end of the coil wiring. The third outer electrode is electrically connected to the second inner electrode. On the other hand, the first or second outer electrode is electrically connected to the first inner electrode. Thus, a magnetic circuit forming portion is constituted by a part of the ferrite layers and the coil wiring in a portion in which the coil wiring is arranged, and an antistatic portion is constituted in a portion in which a remaining part of the ferrite layers, the voltage nonlinear member, and the first and second inner electrodes are arranged.

According to a specific aspect of the present invention, the ferrite layers constituting the magnetic circuit forming portion are ferrite layers having relatively high magnetic permeability, and the ferrite layers constituting a circuit section of the antistatic portion are ferrite layers having relatively low magnetic permeability. The ferrite layers having relatively high magnetic permeability function as magnetic ferrite layers, while the ferrite layers having relatively low magnetic permeability function as nonmagnetic ferrite layers. As a result, a large inductance can be obtained in the magnetic circuit forming portion.

In the composite electronic component according to the present invention, preferably, the ferrite layers having relatively high magnetic permeability are magnetic ferrite layers, and the ferrite layers having relatively low magnetic permeability are nonmagnetic ferrite layers, as described above.

In the composite electronic component according to the present invention, more preferably, the ferrite layers having relatively high magnetic permeability and the ferrite layers having relatively low magnetic permeability are made of ferrite materials belonging to same composition series. In this case, since the ferrite layers are made of the ferrite materials belonging to the same composition series, interlayer peeling between the ferrite layer having relatively high magnetic permeability and the ferrite layer having relatively low magnetic permeability will not readily occur. Accordingly, the insulating reliability can be further increased.

According to another specific aspect of the composite electronic component of the present invention, the first inner electrode and the second inner electrode are arranged in overlapped relation with the voltage nonlinear member interposed therebetween. In this case, since the first and second inner electrode are overlapped over a relatively large area with the voltage nonlinear member interposed therebetween, protection against static electricity can be achieved effectively.

In the present invention, the first inner electrode and the second inner electrode may be opposed to each other with a gap interposed therebetween at a certain height position inside the sintered body. In this case, a thickness of the antistatic portion can be reduced. Accordingly, an overall height of the composite electronic component can be reduced.

According to still another specific aspect of the composite electronic component of the present invention, the composite electronic component includes, as the coil wiring, first and second coil wirings to constitute a common-mode choke coil. In this case, a composite electronic component including the common-mode choke coil and the magnetic circuit forming portion can be provided according to the present invention.

According to still another specific aspect of the composite electronic component of the present invention, the voltage nonlinear member is arranged at an interface between the ferrite layers having relatively high magnetic permeability and the ferrite layers having relatively low magnetic permeability.

According to still another specific aspect of the composite electronic component of the present invention, the voltage nonlinear member is incorporated in the ferrite layers having relatively low magnetic permeability. Thus, the voltage nonlinear member may be embedded inside the ferrite layers having relatively low magnetic permeability.

According to still another specific aspect of the composite electronic component of the present invention, the first to third outer electrodes are formed on an upper surface, a lateral surface, or a lower surface of the sintered body, and a plurality of via hole conductors electrically connected to the first to third outer electrodes are disposed inside the sintered body. In this case, the plural via hole electrodes can be arranged so as to cancel an electrostatic capacity component of the antistatic element. As a result, a magnetic circuit forming portion including a common-mode choke coil with good frequency characteristics, for example, can be constituted.

According to still another specific aspect of the composite electronic component of the present invention, the coil wiring and the first and second inner electrodes are led out to the one or more outer surfaces of the sintered body, and respective portions of the coil wiring and the first and second inner electrodes, the portions being led out to the one or more outer surfaces of the sintered body, are electrically connected to the first to third outer electrodes. In this case, productivity of the composite electronic component can be increased.

Advantageous Effects of Invention

According to the present invention, since the voltage nonlinear member is incorporated in the sintered body and is not exposed to moisture and flux, the insulating reliability of the antistatic portion can be increased. Accordingly, the composite electronic component can be more reliably protected against static electricity. Furthermore, since the sintered body is in the form of a multilayer body of the plural ferrite layers, interlayer peeling will not readily occur. Hence the insulating reliability can be further increased.

DETAILED DESCRIPTION OF THE INVENTION

The present invention will be clarified from the following description of practical embodiments of the present invention with reference to the drawings.

Figure 1:
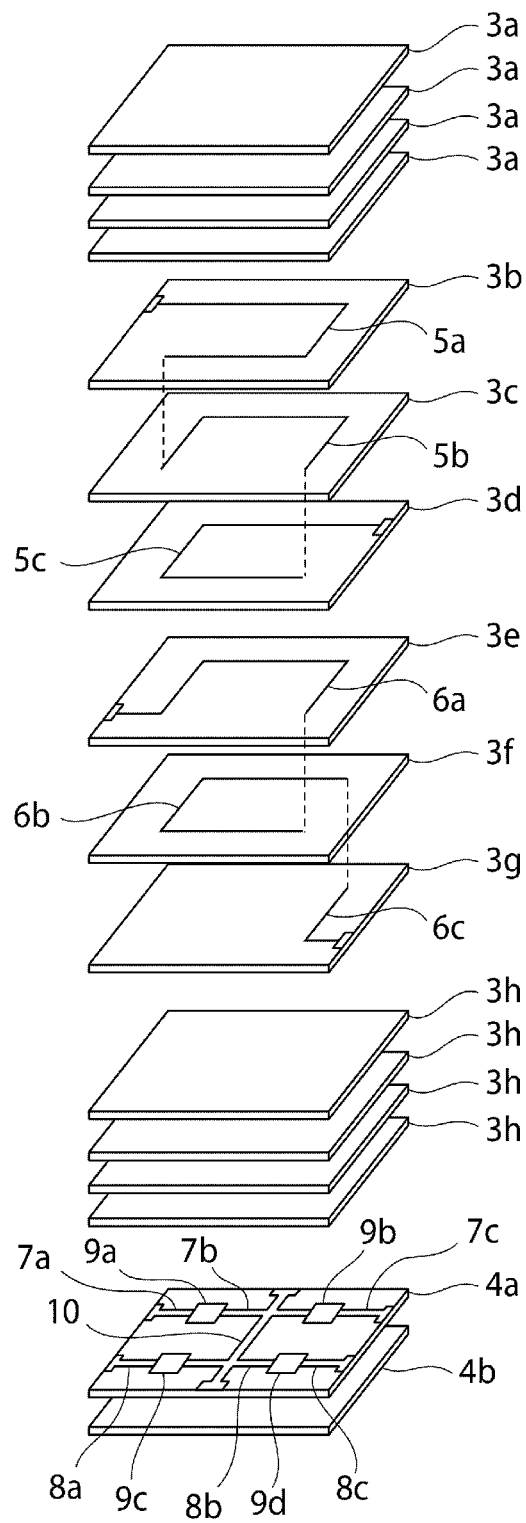
FIG. 1 is an exploded perspective view of a composite electronic component according to a first embodiment of the present invention.
Figure 2:
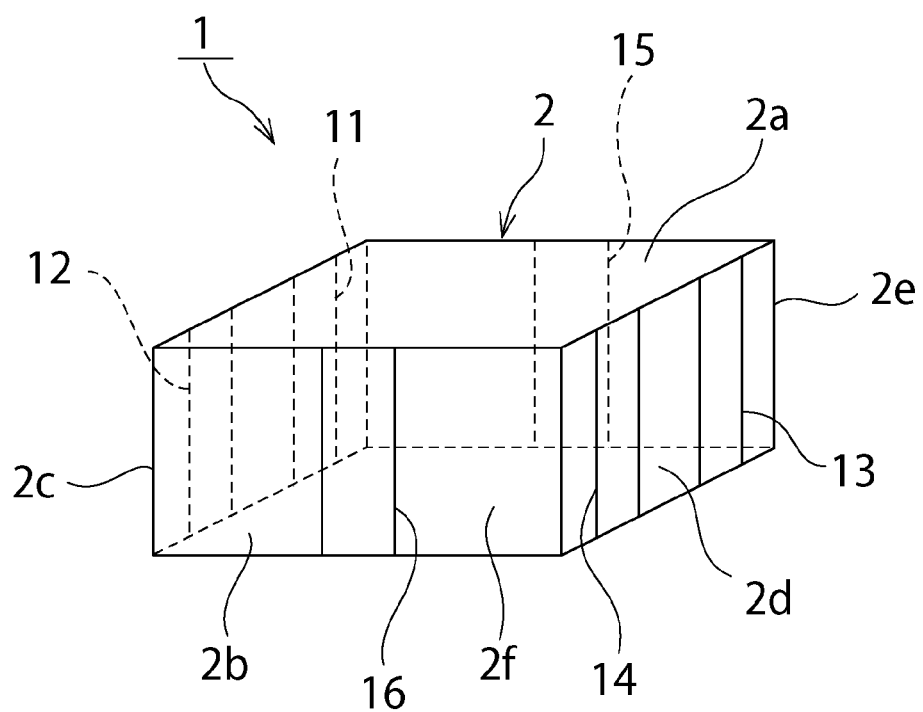
FIG. 2 is a perspective view of the composite electronic component according to the first embodiment.
Figure 3:
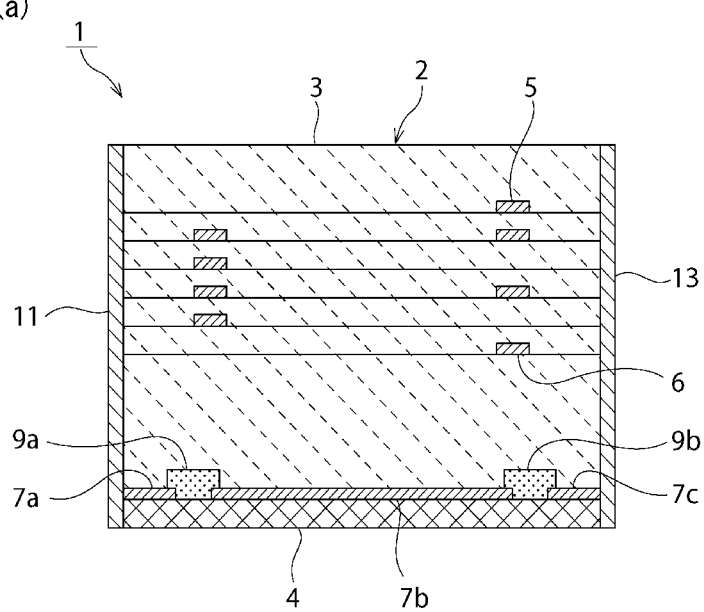
FIGS. 3(*a*) and 3(*b*) are a front sectional view of the composite electronic component according to the first embodiment and a schematic front sectional view of the relevant composite electronic component, respectively.
Figure 3:
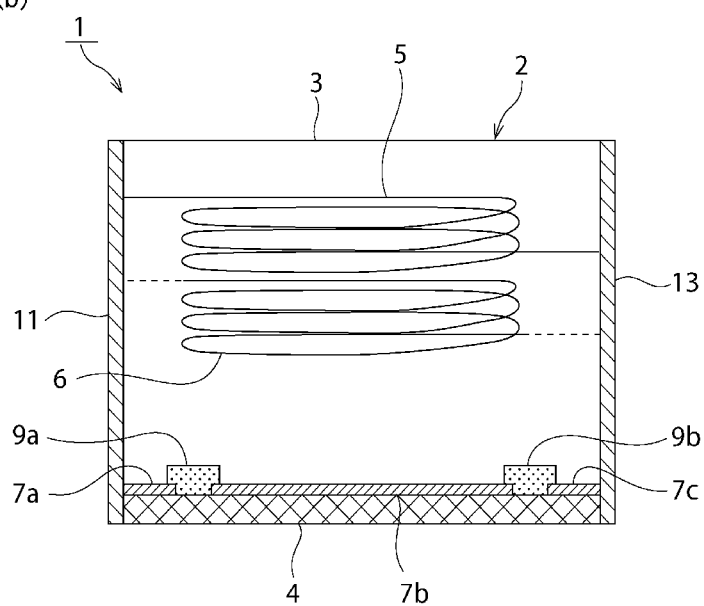
Figure 4:
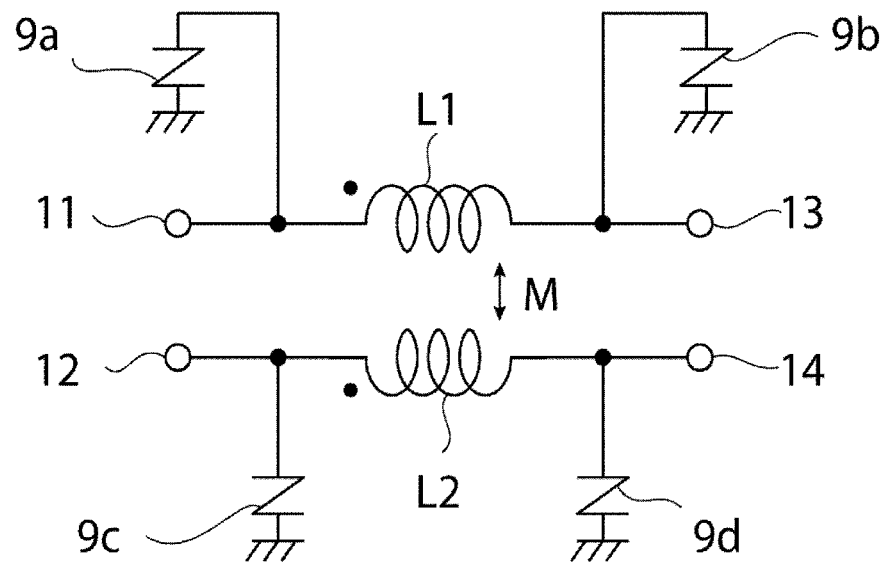
FIG. 4 is an equivalent circuit diagram of the composite electronic component according to the first embodiment of the present invention.

FIG. 1 is an exploded perspective view of a composite electronic component according to a first embodiment of the present invention, and FIG. 2 is a perspective view illustrating an external appearance of the composite electronic component. FIG. 3(*a*) is a front sectional view of the composite electronic component according to the first embodiment, and FIG. 3(*b*) is a schematic front sectional view illustrating an internal structure of the composite electronic component in the simplified form. FIG. 4 is an equivalent circuit diagram of the composite electronic component according to the first embodiment of the present invention.

A composite electronic component 1 includes a sintered body 2. The sintered body 2 is formed by stacking a plurality of ferrite layers and firing the stacked ferrite layers as an integral unit. The sintered body 2 has a rectangular parallelepiped shape.

FIG. 1 is an exploded perspective view illustrating a plurality of ferrite sheets used in the sintered body 2 and an electrode structure inside the sintered body 2.

In this embodiment, as illustrated in FIG. 1, a plurality of magnetic ferrite sheets 3a to 3h and a plurality of nonmagnetic ferrite sheets 4a and 4b are stacked. More specifically, the plural magnetic ferrite sheets 3a are stacked at the top. The magnetic ferrite sheets 3b to 3g including later-described electrodes formed on their upper surfaces are stacked under the plural magnetic ferrite sheets 3a. The plural magnetic ferrite sheets 3h are stacked under the magnetic ferrite sheet 3g.

The magnetic ferrite sheets 3a to 3h constitute a magnetic circuit forming portion described later. More specifically, coil patterns 5a to 5c constituting a first coil wiring 5 are formed on the magnetic ferrite sheets 3b to 3d, respectively. As denoted by dotted lines in the drawing, the coil patterns 5a to 5c are electrically connected to each other by via hole electrodes. The first coil wiring 5 is constituted by the coil patterns 5a to 5c. One end of the coil pattern 5a is led out to an end surface 2c of the sintered body 2. An end portion of the coil pattern 5c is led out to the other end surface 2d of the sintered body 2.

Similarly, coil patterns 6a to 6c are formed on the magnetic ferrite sheets 3e to 3g, respectively. As denoted by dotted lines in the drawing, the coil patterns 6a to 6c are electrically connected to each other by via hole electrodes. A second coil wiring 6 is constituted by the coil patterns 6a to 6c. One end of the coil pattern 6a is led out to the first end surface 2c of the sintered body 2. An end portion of the coil pattern 6c is led out to the second end surface 2d of the sintered body 2.

Because the magnetic ferrite sheets 3a to 3h constitute a common-mode choke coil with the first and second coil wirings 5 and 6, they are each made of magnetic ferrite having relatively high magnetic permeability. The relative magnetic permeability of the magnetic ferrite is not limited to a particular value, but it is about 20 to 500.

On the other hand, the nonmagnetic ferrite sheets 4a and 4b are each made of ferrite having relatively low magnetic permeability. The relative magnetic permeability of such ferrite is not limited to a particular value, but it is about 1 to 10.

Ferrite materials constituting the magnetic ferrite sheets 3a to 3h and the nonmagnetic ferrite sheets 4a and 4b are not limited to particular ones. From the viewpoint of increasing the magnetic permeability of the magnetic ferrite sheets 3a to 3h, however, it is desired to use sheets that are each obtained from ceramic slurry containing ceramic powder of Ni—Zn-based ferrite, Ni—Mg-based ferrite, or Ni—Mg—Zn-based ferrite.

The nonmagnetic ferrite sheets 4a and 4b are disposed to form an antistatic portion. First inner electrodes 7a, 7c, 8a and 8c, second inner electrodes 7b and 8b, and voltage nonlinear members 9a to 9d are disposed on the nonmagnetic ferrite sheet 4a to form the antistatic portion.

More specifically, the first inner electrode 7a, the second inner electrode 7b, and the first inner electrode 7c are arranged successively in a direction interconnecting the first and second end surfaces 2c and 2d of the sintered body 2. The first inner electrode 7a and the second inner electrode 7b are opposed to each other on the same plane with a gap interposed between both the electrodes. The voltage nonlinear member 9a is disposed over the gap in a state bridging the first and second inner electrodes 7a and 7b. One antistatic portion is thus constituted.

Similarly, the second inner electrode 7b and the first inner electrode 7c are opposed to each other with a gap interposed between both the electrodes. The voltage nonlinear member 9b is disposed over the gap in a state bridging the second inner electrode 7b and the first inner electrode 7c. Another one antistatic portion is thus constituted.

The first inner electrode 8a, the second inner electrode 8b, and the first inner electrode 8c are also arranged successively in the direction interconnecting the first and second end surfaces 2c and 2d of the sintered body 2. As in the above case, the voltage nonlinear member 9c is disposed over the gap between the first inner electrode 8a and the second inner electrode 8b. The voltage nonlinear member 9d is disposed over the gap between the second inner electrode 8b and the first inner electrode 8c. Thus, a total of four antistatic portions are constituted on the nonmagnetic ferrite sheet 4a.

The first inner electrode 7a, the second inner electrode 7b, and the first inner electrode 7c are arranged on the side closer to a first lateral surface 2e of the sintered body 2. On the other hand, the first inner electrode 8a, the second inner electrode 8b, and the first inner electrode 8c are formed on the side closer to a second lateral surface 2f of the sintered body 2.

A wiring electrode 10 is formed to connect the second inner electrode 7b and the second inner electrode 8b. The wiring electrode 10 is formed until reaching the first and second lateral surfaces 2e and 2f of the sintered body 2.

In this embodiment, the wiring electrode 10 is arranged at a midpoint in a direction interconnecting the first and second end surfaces 2c and 2d of the sintered body 2. The voltage nonlinear member 9a and the voltage nonlinear member 9b are arranged in symmetric relation with respect to the wiring electrode 10 being a center. Similarly, the voltage nonlinear member 9c and the voltage nonlinear member 9d are arranged in symmetric relation with respect to the wiring electrode 10.

The coil patterns 5a to 5c and 6a to 6c, the first inner electrodes 7a, 7c, 8a and 8c, the second inner electrodes 7b and 8b, and the wiring electrode 10 can be easily formed by, e.g., screen printing of a conductive paste. Accordingly, a production process can be simplified in comparison with the case using the thin film formation method.

The voltage nonlinear members 9a to 9d can also be easily formed by screen printing of a voltage nonlinear material.

The coil patterns 5a to 5c and 6a to 6c, the first inner electrodes 7a, 7c, 8a and 8c, the second inner electrodes 7b and 8b, and the wiring electrode 10 can be formed using an appropriate metallic material, such as Ag, Al, Cu, or an alloy containing any of those elements as a main ingredient.

The voltage nonlinear members 9a to 9d can be formed using an appropriate voltage nonlinear material, such as ZnO.

As illustrated in FIG. 2, the sintered body 2 has an upper surface 2a, a lower surface 2b, the first and second end surfaces 2c and 2d, and the first and second lateral surfaces 2e and 2f. On the first end surface 2c of the above-mentioned surfaces, first outer electrodes 11 and 12 are formed to extend in the up-and-down direction, as denoted by dotted lines. The first outer electrode 11 is disposed to be electrically connected to the end portion of the coil pattern 5a and to the first inner electrode 7a. The first outer electrode 12 is disposed to be electrically connected to the end portion of the coil pattern 6a and to the first inner electrode 8a. Second outer electrodes 13 and 14 are formed on the second end surface 2d. The second outer electrode 13 is disposed in opposing relation to the first outer electrode 11. The second outer electrode 13 is disposed to be electrically connected to the end portion of the coil pattern 5c and to the first inner electrode 7c. The second outer electrode 14 is disposed in opposing relation to the first outer electrode 12. The second outer electrode 14 is disposed to be electrically connected to the end portion of the coil pattern 6c and to the first inner electrode 8c. In addition, third outer electrodes 15 and 16 connected to the ground potential are disposed on the first and second lateral surfaces 2e and 2f, respectively. The third outer electrodes 15 and 16 are electrically connected to the wiring electrode 10.

The above-mentioned first to third outer electrodes 11 to 16 can be formed by an appropriate electrode formation method, such as coating and firing a conductive paste.

In the composite electronic component 1 of this embodiment, as illustrated in FIGS. 3(a) and 3(b), the common-mode choke coil including the first and second coil wirings 5 and 6 is constituted within the sintered body 2 on the upper side. Thus, the magnetic circuit forming portion is constituted in a magnetic layer 3. Furthermore, the antistatic portions including the voltage nonlinear members 9a to 9d are formed in a lower nonmagnetic layer 4. Stated in another way, the voltage nonlinear members 9a to 9d constituting the antistatic portions are incorporated at a position different in a height direction from that of the coil wirings 5 and 6. Here, the term "height direction" implies a direction in which the ferrite layers 3a to 3h, 4a and 4b are stacked, i.e., a direction interconnecting the upper surface 2a and the lower surface 2b of the sintered body 2.

Accordingly, a circuit illustrated in FIG. 4 is constituted in this embodiment. In the illustrated circuit, a coil element L1 constituted by the coil patterns 5a to 5c and a coil element L2 constituted by the coil patterns 6a to 6c are magnetically coupled to each other as denoted by M, whereby the common-mode choke coil is constituted. Moreover, respective antistatic portions are constituted by the voltage nonlinear members 9a to 9d.

In this embodiment, as described above, the magnetic circuit forming portion, which includes the common-mode choke coil, and the antistatic portions are formed integrally inside the sintered body 2. As a result, the common-mode choke coil protected against static electricity can be constituted.

In the composite electronic component 1 of this embodiment, particularly, the sintered body 2 is obtained by stacking the magnetic ferrite sheets 3a to 3h and the nonmagnetic ferrite sheets 4a and 4b, and then firing the stacked sheets as an integral unit. A portion where the magnetic ferrite sheets 3a to 3h are stacked constitutes the magnetic layer 3 after the firing. Similarly, a portion where the nonmagnetic ferrite sheets 4a and 4b are stacked becomes the nonmagnetic layer 4. The magnetic ferrite sheets 3a to 3h and the nonmagnetic ferrite sheets 4a and 4b are each made of ferrite. Therefore, when the magnetic and nonmagnetic ferrite sheets are fired as an integral unit, their shrinkage rates are not so different from each other in a process of firing the magnetic layer 3 and the nonmagnetic layer 4. The coefficients of thermal expansion of the magnetic and nonmagnetic ferrite sheets are also not so different from each other. Accordingly, interlayer peeling will not readily occur between the magnetic layer 3 and the nonmagnetic layer 4.

More preferably, the magnetic ferrite sheets 3a to 3h and the nonmagnetic ferrite sheets 4a and 4b are made of ferrites belonging to the same composition series. From the viewpoint of increasing inductance, Ni—Zn-based, Ni—Mg-based, or Ni—Mg—Zn-based ferrite materials are preferably used for the magnetic ferrite sheets 3a to 3h. In such a case, the expression "belonging to the same composition series" implies that the magnetic ferrite sheets and the nonmagnetic ferrite sheets are made of Ni—Zn-based ferrites. Even when the Ni—Zn-based ferrites belonging to the same series are used, the magnetic permeability of each ferrite can be controlled by adjusting the content of Cu, for example, which is added as an accessory constituent. In the magnetic ferrite sheets 3a to 3h, the magnetic permeability can be increased by relatively increasing the content of the Cu constituent. In the nonmagnetic ferrite sheets 4a and 4b, the magnetic permeability can be reduced by relatively reducing the content of the Cu constituent.

When the ferrites belonging to the same composition series are used, the difference in coefficient of thermal expansion between the magnetic layer and the nonmagnetic layer can be further reduced, so that interlayer peeling can be suppressed more effectively.

In the composite electronic component 1, since interlayer peeling between the magnetic layer 3 and the nonmagnetic layer 4 will not readily occur as described above, reduction of insulating reliability due to intrusion of moisture, for example, will also not readily occur. Moreover, degradation of insulating performance due to intrusion of flux during reflow soldering, for example, will similarly not readily occur.

In the related art in which the varistor material is included in the stack as disclosed in Patent Document 3, the voltage nonlinear material constituting the antistatic portion is exposed to an outer surface. The voltage nonlinear material is poor in insulating reliability. Thus, there is a risk that the insulating performance may degrade due to absorption of moisture or intrusion of flux during the reflow soldering.

In contrast, in the composite electronic component of this embodiment, the voltage nonlinear members 9a to 9d are incorporated in the sintered body 2. Accordingly, the voltage nonlinear members 9a to 9d are not exposed to moisture and flux, whereby the insulating reliability of the antistatic portion can be increased effectively. It is hence possible to reliably protect the composite electronic component against static electricity.

Figure 5:
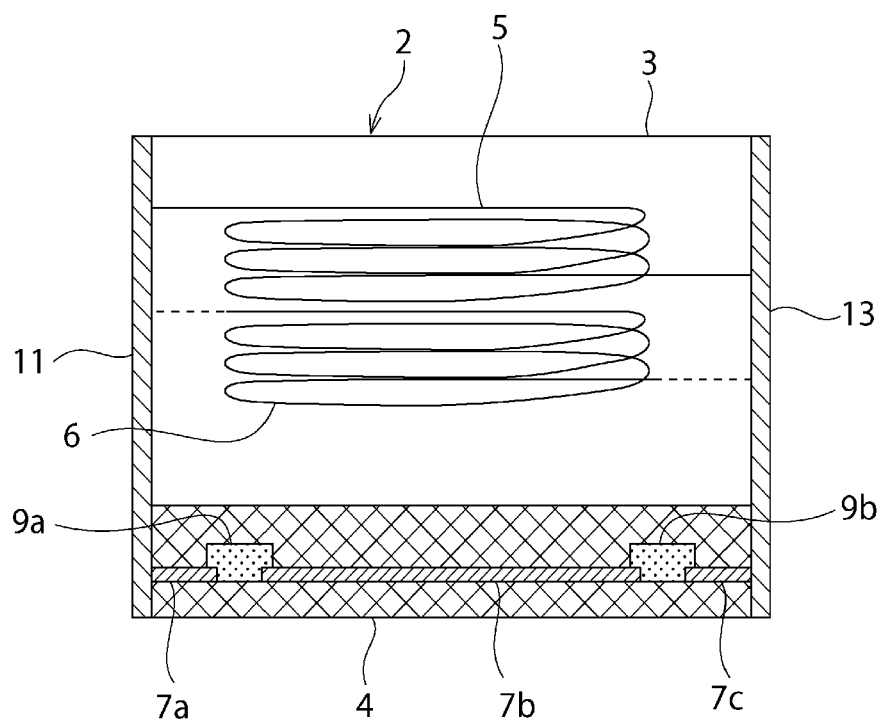
FIG. 5 is a schematic front sectional view of a composite electronic component according to a modification of the first embodiment.

In the embodiment described above, the four antistatic portions including the voltage nonlinear members 9a to 9d are constituted on the nonmagnetic ferrite sheet 4a. Stated in another way, the antistatic portions are disposed at the interface between the magnetic layer 3 and the nonmagnetic layer 4. However, as a modification illustrated in FIG. 5, the antistatic portions including the voltage nonlinear members 9a and 9b may be constituted within the nonmagnetic layer 4. In that case, the electrode structure and the voltage nonlinear members 9a to 9d on the nonmagnetic ferrite sheet 4a, illustrated in FIG. 1, may be disposed on the nonmagnetic ferrite sheet 4b, which is the lowermost layer in FIG. 1.

However, it is preferable, like the above-described embodiment, to dispose the four antistatic portions on the nonmagnetic ferrite sheet 4a, i.e., to constitute the antistatic portions at the interface between the magnetic layer 3 and the nonmagnetic layer 4. With such an arrangement, the volume of the magnetic layer can be increased without increasing inductance of the wiring from a rear surface (mount surface) of the composite electronic component to the antistatic portions. As a result, the performance of the common-mode choke coil can be improved.

Figure 6:
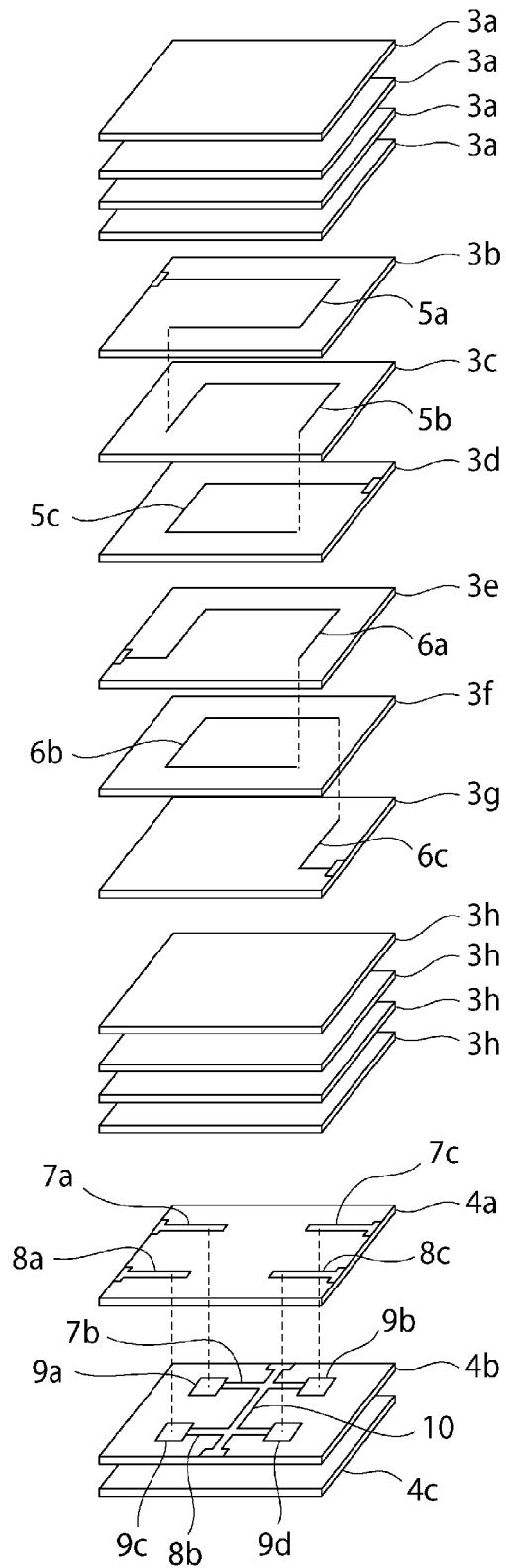
FIG. 6 is an exploded perspective view of a composite electronic component according to a second embodiment of the present invention.
Figure 7:
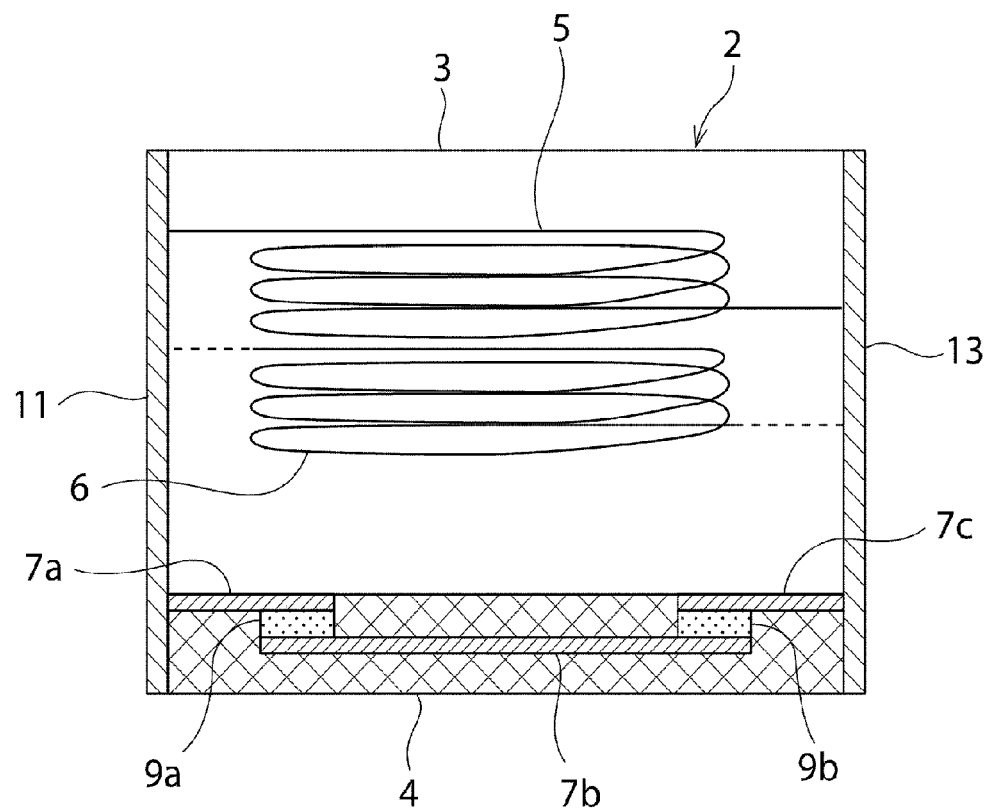
FIG. 7 is a schematic front sectional view of the composite electronic component according to the second embodiment.

FIG. 6 is an exploded perspective view of a sintered body used in a composite electronic component according to a second embodiment of the present invention, and FIG. 7 is a schematic front sectional view of the composite electronic component according to the second embodiment. The composite electronic component of the second embodiment is different from that of the first embodiment in structure of the antistatic portions. It is hence to be noted that the same parts as those in the first embodiment are denoted by the same reference signs and the description of those parts in the first embodiment is applied to here without repeating the description.

In the second embodiment, as illustrated in FIG. 6, nonmagnetic ferrite sheets 4a to 4c are stacked to constitute the antistatic portions. A plurality of first inner electrodes 7a, 7c, 8a and 8c are formed on the nonmagnetic ferrite sheet 4a. Second inner electrodes 7b and 8b and a wiring electrode 10 are formed on the nonmagnetic ferrite sheet 4b.

Taking the first inner electrode 7a and the second inner electrode 7b as an example, the first inner electrode 7a and the second inner electrode 7b are disposed to be overlapped in a certain region with each other while the nonmagnetic ferrite sheet 4a is interposed between both the electrodes. In that overlapped region, as denoted by dotted lines in FIG. 6, a voltage nonlinear member 9a penetrating through the nonmagnetic ferrite sheet 4a in a state filled therein is disposed on the second inner electrode 7b. In other words, as illustrated in FIG. 7, the first inner electrode 7a and the second inner electrode 7b are opposed to each other in the direction of thickness of the sintered body 2 with the voltage nonlinear member 9a interposed between both the electrodes. Thus, in the present invention, the first inner electrode 7a and the second inner electrode 7b may be opposed to each other within the antistatic portion in face-to-face relation in the direction of thickness of the sintered body 2 with the voltage nonlinear member 9a interposed therebetween.

In the second embodiment, an area of the region where the first inner electrode 7a and the second inner electrode 7b are opposed to each other is larger than that in the first embodiment. Therefore, the voltage nonlinear member 9a can exhibit a higher antistatic effect.

In the second embodiment, however, a comparatively large electrostatic capacity generates between the first inner electrode 7a and the second inner electrode 7b. Such a large electrostatic capacity causes influences upon the characteristics of the common-mode choke coil. From the viewpoint of reducing those influences, therefore, the first inner electrode 7a and the second inner electrode 7b are preferably opposed to each other on the same plane with the gap interposed between both the electrodes as in the first embodiment.

In the second embodiment, since the area of the region where the first and second inner electrodes are opposed to each other is larger than that in the first embodiment, a total area through which electrostatic signals flow into the voltage nonlinear members 9a to 9d can be increased. Accordingly, protection against static electricity can be obtained more effectively. However, when the composite electronic component is used for a high-speed signal, the first embodiment is more preferable because an electrostatic capacity is smaller in each antistatic portion and higher impedance matching characteristics are obtained in the first embodiment.

As illustrated in FIG. 6, the second inner electrode 7b and the first inner electrode 7c are also disposed to be overlapped with each other while the voltage nonlinear member 9b is interposed between both the electrodes. Similarly, other pairs of the first inner electrode 8a and the second inner electrode 8b and the first inner electrode 8c and the second inner electrode 8b are opposed to each other in face-to-face relation per pair with the voltage nonlinear members 9c and 9d interposed therebetween, respectively.

The antistatic portions including the voltage nonlinear members 9a to 9b in the second embodiment can be formed, for example, as follows. A through-hole is formed in a nonmagnetic ferrite sheet by, e.g., a laser. A voltage nonlinear material is filled in the through-hole. The nonmagnetic ferrite sheet in which the voltage nonlinear material has been thus filled is stacked between the first inner electrode and the second inner electrode.

The wiring electrode 10 is constituted similarly to that in the first embodiment. Thus, also in the composite electronic component 21 of the second embodiment, four antistatic portions are incorporated in the sintered body 2. Thus, as in the first embodiment, since the voltage nonlinear members 9a to 9d are not exposed to moisture, flux, etc., the insulating reliability can be increased.

Moreover, also in the second embodiment, since the magnetic layer 3 and the non-magnetic layer 4 are each made of ferrite, interlayer peeling will not readily occur, whereby the insulating reliability is further increased.

Figure 8:
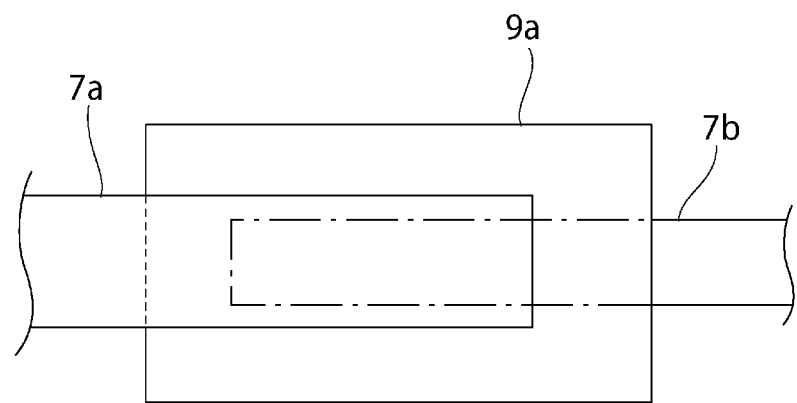
FIGS. 8(*a*) and 8(*b*) are a plan view and a partly cut-out front sectional view, respectively, illustrating a modification of a multilayer structure of first and second inner electrodes and a voltage nonlinear member in the second embodiment.
Figure 8:
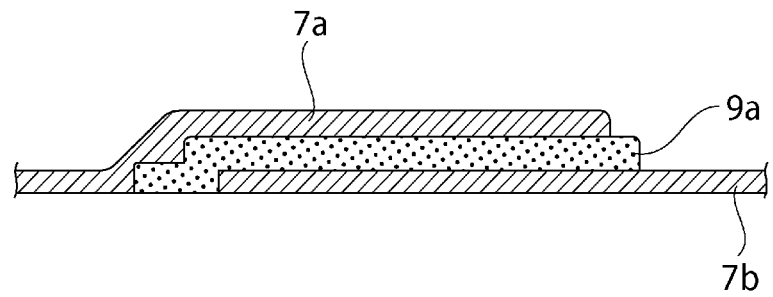

As illustrated in FIGS. 8(*a*) and 8(*b*), the antistatic portion may be formed by printing the voltage nonlinear member 9a on the second inner electrode 7b, and by further printing the first inner electrode 7a on the voltage nonlinear member 9a. Stated in another way, the antistatic portion is not limited to the structure in which the inner electrodes formed on different nonmagnetic ferrite sheets are connected to each other by the voltage nonlinear member that is filled in a through-hole formed in the nonmagnetic ferrite sheet. In addition, the first inner electrode 7a and the second inner electrode 7b desirably have different widths from each other. This ensures that even when a widthwise position of the second inner electrode 7b having a relatively small width is displaced, the area of the region where the first inner electrode 7a and the second inner electrode 7b are opposed to each other can be kept constant. In such a case, the voltage nonlinear member 9a desirably has a larger width than the first inner electrode 7a having a relatively large width. It is to be noted that the first inner electrode 7a may be formed in a relatively small width.

Figure 9:
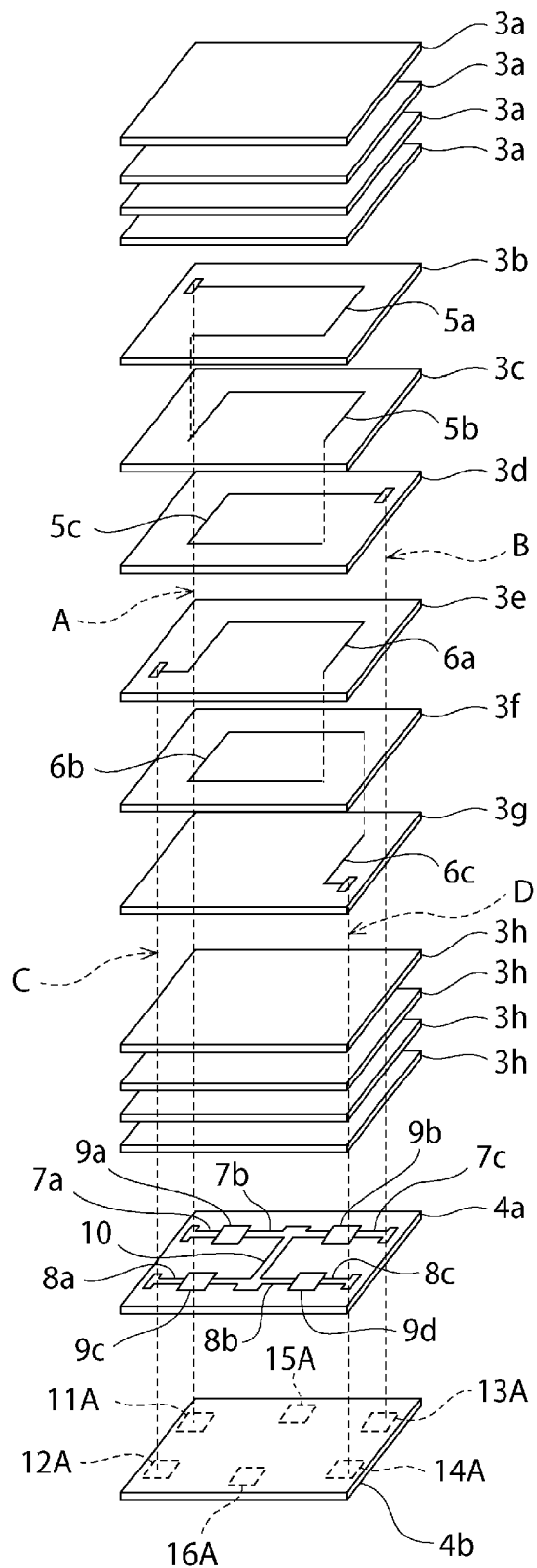
FIG. 9 is an exploded perspective view of a composite electronic component according to a third embodiment of the present invention.
Figure 10:
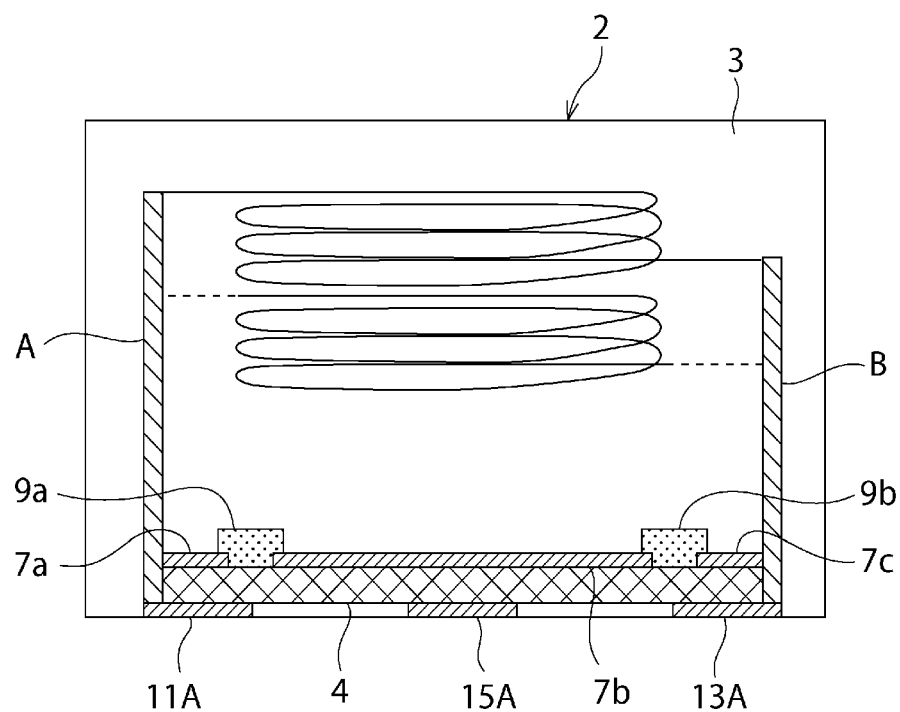
FIG. 10 is a schematic front sectional view of the composite electronic component according to the third embodiment.
Figure 11:
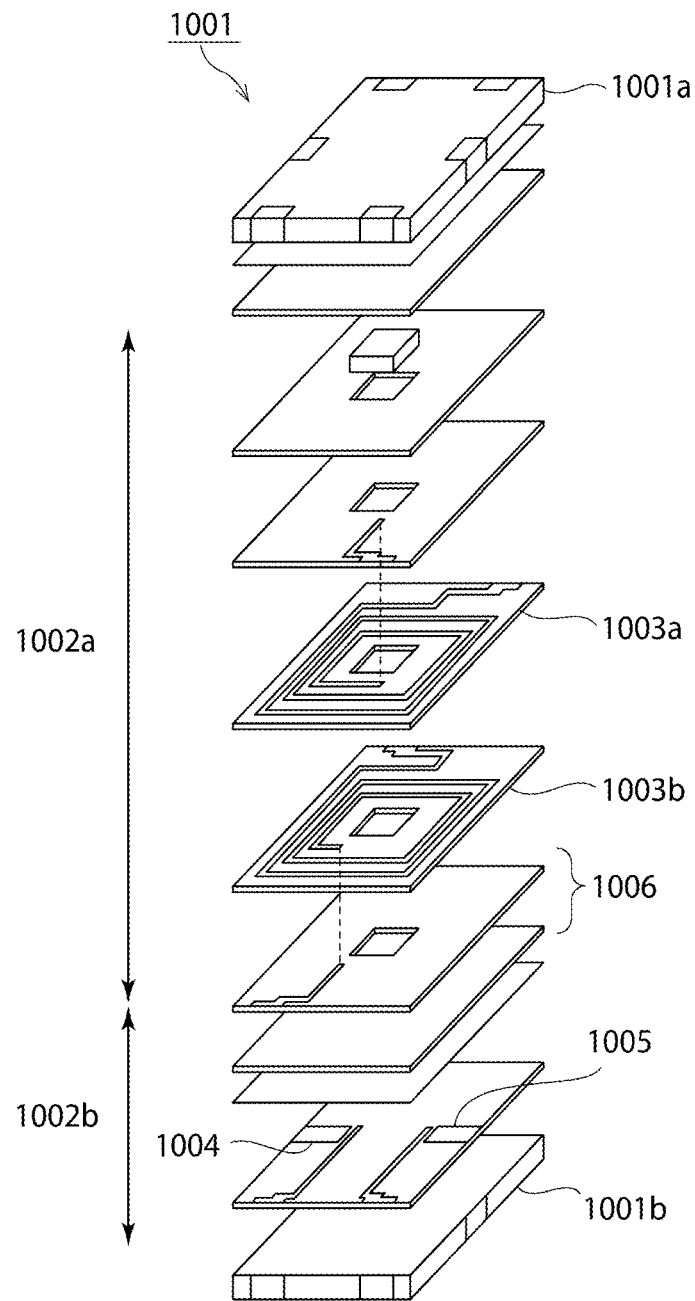
FIG. 11 is an exploded perspective view illustrating one example of a composite electronic component according to related art.

FIG. 9 is an exploded perspective view of a sintered body used in a composite electronic component according to a third embodiment of the present invention, and FIG. 10 is a schematic front sectional view of the composite electronic component according to the third embodiment.

In the third embodiment, a plurality of outer electrodes are formed on the lower surface of the sintered body 2, and inner electrode structures are electrically connected by via hole electrodes. The other points are similar to those in the first embodiment. Hence the same parts as those in the first embodiment are denoted by the same reference signs and the description of those parts in the first embodiment is applied to here without repeating the description.

In more detail, first to third outer electrodes 11A to 16A are formed on a lower surface of the nonmagnetic ferrite sheet 4b. Any outer electrodes are not formed on the first and second lateral surfaces 2e and 2f and the first and second end surfaces 2c and 2d of the sintered body 2.

As illustrated in FIG. 9, the end portion of the coil pattern 5a is electrically connected to the first outer electrode 11A by a via hole electrode denoted by a dotted line A. Similarly, the end portion of the coil pattern 5c is electrically connected to the second outer electrode 13A by a via hole electrode denoted by a dotted line B without being led out to the end surface of the sintered body 2. The end portion of the coil pattern 6a is electrically connected to the first outer electrode 12A by a via hole electrode C denoted by a dotted line, and the end portion of the coil pattern 6c is electrically connected to the second outer electrode 14A by a via hole electrode denoted by a dotted line D.

Opposite ends of the wiring electrode 10 are formed not to extend until reaching the lateral surfaces of the sintered body 2. The wiring electrode 10 is electrically connected to the third outer electrodes 15A and 16A by via hole electrodes C and D denoted by dotted lines. As described above, the electrodes inside the sintered body 2 may be electrically connected to the first to third outer electrodes 11A to 16A by the via hole electrodes.

In the third embodiment, the via hole electrodes A to D can serve to suppress the influences of electrostatic capacities in the antistatic portions. More specifically, by arranging the via hole electrodes A to D inside the magnetic layer for electrical connection, minute inductance components can be formed by the via hole electrodes A to D. Because the electrostatic capacity in the antistatic portions is known, the via hole electrodes A to D can be formed so as to realize inductance matching with the known electrostatic capacity. As a result, degradation of a signal caused by the influences of the antistatic portions can be suppressed.

The matching between the inductance of the via hole electrodes A to D and the above-mentioned electrostatic capacity can be achieved with the following methods, for example.

There are a method of changing the capacity in the antistatic portions, a method of increasing the number of via hole electrodes and reducing the inductance thereof, and/or a method of forming the via hole electrodes in a meander shape and increasing the inductance thereof.

In the third embodiment, any outer electrodes are not formed on the end surfaces and the lateral surfaces of the sintered body 2. It is complicated to form electrodes on the end surfaces and the lateral surfaces. Thus, the process of forming the outer electrodes can be simplified in the third embodiment. As a result, the cost can be further reduced.

While in the first to third embodiments the common-mode choke coil is constituted in the magnetic layer, the magnetic circuit forming portion in the present invention is not limited to the common-mode choke coil, and only one coil wiring may be formed.

While in the first to third embodiments the four antistatic portions are constituted, the number of antistatic portions is not limited to four. Of the voltage nonlinear members 9a to 9d illustrated in FIG. 1, for example, only the voltage nonlinear members 9a and 9c or only the voltage nonlinear members 9b and 9d may be disposed. In the case of constituting two antistatic portions, two voltage nonlinear members are desirably arranged on the side where the electrostatic signal is input from the outside, in order to effectively achieve the protection against static electricity. Therefore, when the second outer electrodes 13 and 14 are connected to the side where static electricity inputs, for example, it is desired that the voltage nonlinear members 9b and 9d are disposed.

More desirably, as in the above-described embodiments, four antistatic portions are disposed symmetrically with respect to the wiring electrode 10 that is connected to the ground potential. With such an arrangement, since the composite electronic component 1 has symmetry between the side including the first end surface 2c and the side including the second end surface 2d, an operation of selecting the orientation of the composite electronic component can be omitted in use.

REFERENCE CHARACTER LIST

1 . . . composite electronic component
2 . . . sintered body
2a . . . upper surface
2b . . . lower surface
2c, 2d . . . first and second end surfaces
2e, 2f . . . first and second lateral surfaces
3 . . . magnetic layer
3a to 3h . . . magnetic ferrite sheets
4 . . . nonmagnetic layer
4a to 4c . . . nonmagnetic ferrite sheets
5, 6 . . . first and second coil wirings
5a to 5c, 6a to 6c . . . coil patterns
7a, 7c, 8a, 8c . . . first inner electrodes
7b, 8b . . . second inner electrodes
9a to 9d . . . voltage nonlinear members
10 . . . wiring electrode
11, 12, 11A, 12A . . . first outer electrodes
13, 14, 13A, 14A . . . second outer electrodes
15, 16, 15A, 16A . . . third outer electrodes

The invention claimed is:

1. A composite electronic component comprising:
a sintered body formed by stacking a plurality of ferrite layers and by firing the ferrite layers as an integral unit;
a coil wiring disposed inside the sintered body;
a plurality of voltage nonlinear members incorporated in the sintered body and positioned at a height different from a height of the coil wiring in the sintered body;
first and second inner electrodes opposed to each other with the voltage nonlinear members interposed between the first and second inner electrodes;
first, second, and third outer electrodes formed on one or more outer surfaces of the sintered body; and
a wiring electrode arranged at a midpoint in a direction interconnecting two of the one or more outer surface, wherein
the first outer electrode is electrically connected to one end of the coil wiring,
the second outer electrode is electrically connected to the other end of the coil wiring,
the third outer electrode is electrically connected to the second inner electrode,
the first or second outer electrode is electrically connected to the first inner electrode,
the wiring electrode is connected to a ground potential and forms an axis of symmetry about which the plurality of voltage nonlinear members are arranged,
the plurality of voltage nonlinear members are arranged in a symmetrical relationship with respect to the wiring electrode,
a magnetic circuit forming portion is constituted by a part of the ferrite layers and the coil wiring in a portion in which the coil wiring is arranged, and
an antistatic portion is constituted in a portion in which a remaining part of the ferrite layers, the voltage nonlinear members, and the first and second inner electrodes are arranged.

2. The composite electronic component according to claim 1, wherein the ferrite layers constituting the magnetic circuit forming portion are ferrite layers having relatively high magnetic permeability, and the ferrite layers constituting a circuit section of the antistatic portion are ferrite layers having relatively low magnetic permeability.

3. The composite electronic component according to claim 2, wherein the ferrite layers having relatively high magnetic permeability are magnetic ferrite layers, and the ferrite layers having relatively low magnetic permeability are nonmagnetic ferrite layers.

4. The composite electronic component according to claim 2, wherein the ferrite layers having relatively high magnetic permeability and the ferrite layers having relatively low magnetic permeability are made of ferrite materials belonging to same composition series.

5. The composite electronic component according to claim 1, wherein the first inner electrode and the second inner electrode are arranged in overlapped relation with the voltage nonlinear members interposed therebetween.

6. The composite electronic component according to claim 1, wherein the first inner electrode and the second inner electrode are opposed to each other with a gap interposed therebetween at a certain height position inside the sintered body.

7. The composite electronic component according to claim 1, wherein the composite electronic component includes, as the coil wiring, first and second coil wirings to constitute a common-mode choke coil.

8. The composite electronic component according to claim 2, wherein the voltage nonlinear members are arranged at an interface between the ferrite layers having relatively high magnetic permeability and the ferrite layers having relatively low magnetic permeability.

9. The composite electronic component according to claim 2, wherein the voltage nonlinear members are incorporated in the ferrite layers having relatively low magnetic permeability.

10. The composite electronic component according to claim 1, wherein the first, second, and third outer electrodes are formed on an upper surface, a lateral surface, or a lower surface of the sintered body, and a plurality of via hole conductors electrically connected to the first, second, and third outer electrodes are disposed inside the sintered body.

11. The composite electronic component according to claim 1, wherein the coil wiring and the first and second inner electrodes are led out to the one or more outer surfaces of the sintered body, and respective portions of the coil wiring and the first and second inner electrodes, the portions being led out to the one or more outer surfaces of the sintered body, are electrically connected to the first, second, and third outer electrodes.

12. The composite electronic component according to claim 1, wherein the voltage nonlinear members are located entirely inside of the sintered body.

13. The composite electronic component according to claim 1, wherein the first inner electrode and the second inner electrode have different widths from each other.

14. The composite electronic component according to claim 10, wherein the antistatic portion is located between the first outer electrode and the magnetic circuit forming portion.

* * * * *